(12) United States Patent
Greenberg et al.

(10) Patent No.: US 9,190,479 B1
(45) Date of Patent: Nov. 17, 2015

(54) TRANSISTOR STRUCTURE HAVING AN ELECTRICAL CONTACT STRUCTURE WITH MULTIPLE METAL INTERCONNECT LEVELS STAGGERING ONE ANOTHER

(71) Applicant: International Business Machines Cporporation, Armonk, NY (US)

(72) Inventors: David R. Greenberg, Nyack, NY (US); Jean-Olivier Plouchart, New York, NY (US); Alberto Valdes-Garcia, White Plains, NY (US)

(73) Assignee: GLOBALFOUNDRIES U.S. 2 LLC, Hopewell Junction, NY (US)

( * ) Notice: Subject to any disclaimer, the term of this patent is extended or adjusted under 35 U.S.C. 154(b) by 0 days.

(21) Appl. No.: 14/451,493

(22) Filed: Aug. 5, 2014

Related U.S. Application Data

(62) Division of application No. 13/347,851, filed on Jan. 11, 2012, now Pat. No. 8,872,279, which is a division of application No. 12/116,470, filed on May 7, 2008, now Pat. No. 8,178,908.

(51) Int. Cl.
*H01L 27/088* (2006.01)
*H01L 29/423* (2006.01)
(Continued)

(52) U.S. Cl.
CPC ........ *H01L 29/4238* (2013.01); *H01L 23/4824* (2013.01); *H01L 29/78* (2013.01); *H01L 2924/0002* (2013.01); *H01L 2924/14* (2013.01); *H01L 2924/30105* (2013.01)

(58) Field of Classification Search
CPC ............ H01L 23/4824; H01L 29/0843; H01L 29/1029; H01L 29/41725; H01L 29/4238; H01L 29/7831; H01L 29/78; H01L 2924/0002; H01L 2924/14; H01L 2924/30105

USPC ............ 257/401, E27.06, 207, 211, 758, 767
See application file for complete search history.

(56) References Cited

U.S. PATENT DOCUMENTS 5,990,504 A * 11/1999 Morifuji ........................ 257/270
6,524,905 B2   2/2003 Yamamichi et al.
(Continued)

FOREIGN PATENT DOCUMENTS

JP   2006313824 A   11/2006
WO  2007002158 A2   1/2007

OTHER PUBLICATIONS

H.M.J. Boots et al., "Scaling of Characteristic Frequencies in RF CMOS," IEEE Trans. Elect. Devices, Dec. 2004, pp. 2102-2108, vol. 51, No. 12.

(Continued)

*Primary Examiner* — Anh Mai
(74) *Attorney, Agent, or Firm* — Ryan, Mason & Lewis, LLP

(57) ABSTRACT

An electrical contact structure distributes current along a length thereof. The electrical contact structure includes a plurality of n metal rectangles on n levels of metal. The rectangle on one metal level is at least as wide in width and vertically covers in width the rectangle on the metal level immediately below. The rectangle on one metal level is shorter in length than and substantially aligned at a first end with the rectangle on the metal level immediately below. Rectangle first ends are substantially aligned. Features of an exemplary FET transistor of this invention are a source and drain terminal electrical contact structure, a multi-level metal ring connecting gate rectangles on both ends, and a wider-than-minimum gate-to-gate spacing. The invention is useful, for example, in an electromigration-compliant, high performance transistor.

8 Claims, 11 Drawing Sheets

(51) Int. Cl.
*H01L 23/482* (2006.01)
*H01L 29/78* (2006.01)

(56) References Cited

U.S. PATENT DOCUMENTS

| | | | |
|---|---|---|---|
| 6,747,307 B1 | 6/2004 | Vathulya et al. | |
| 6,888,197 B2 | 5/2005 | Ni et al. | |
| 6,949,830 B2 | 9/2005 | Owada et al. | |
| 6,958,541 B2 | 10/2005 | Erickson et al. | |
| 7,109,558 B2 * | 9/2006 | Nakano et al. | 257/401 |
| 7,132,717 B2 | 11/2006 | Su et al. | |
| 7,355,217 B1 * | 4/2008 | Brand | 257/202 |
| 7,893,536 B2 | 2/2011 | Takada et al. | |
| 2001/0045670 A1 | 11/2001 | Nojiri | |
| 2003/0064574 A1 * | 4/2003 | Parker et al. | 438/558 |
| 2003/0214043 A1 | 11/2003 | Saitoh et al. | |
| 2004/0002187 A1 | 1/2004 | Block et al. | |
| 2004/0195660 A1 | 10/2004 | Hamada et al. | |
| 2006/0006547 A1 | 1/2006 | Matsunaga | |
| 2006/0264040 A1 | 11/2006 | Takada et al. | |
| 2006/0267110 A1 | 11/2006 | Chen | |
| 2006/0289994 A1 | 12/2006 | Greenberg et al. | |
| 2007/0102765 A1 | 5/2007 | Tsai et al. | |
| 2007/0187780 A1 * | 8/2007 | Tiemeijer | 257/401 |
| 2009/0213522 A1 | 8/2009 | Kim et al. | |
| 2011/0241126 A1 | 10/2011 | Herberholz | |

OTHER PUBLICATIONS

B. Heydari et al., "Low-Power mm-Wave Components up to 104GHz in 90nm CMOS," in IEEE International Solid-State Circuits Conf., Dig. Tech. Papers, Feb. 2007, pp. 200-201.

J. Scholvin et al., "Fundamental Power and Frequency Limits of Deeply-Scaled CMOS for RF Power Applications," in IEEE International Electron Devices Meeting, Dec. 2006, pp. 1-4.

J. Scholvin et al., "Performance and Limitations of 65nm CMOS for Integrated Rf Power Applications," in IEEE International Electron Devices Meeting, Dec. 2005, pp. 369-372.

J. Scholvin et al., "RF Power Potential of 90 nm CMOS: Device Options, Performance, and Reliability," in IEEE International Electron Devices Meeting, Dec. 2004, pp. 455-458.

A. Nakamura et al., "Layout Optimization of RF CMOS in the 90nm Generation by a Physics-Based Model Including the Multi-Finger Wiring Effect" in IEEE Radio Frequency Integrated Circuits Symposium, Jun. 2006, pp. 419-422.

M. Tomaska et al., "RF power transistor design in standard digital CMOS technology", IEEE International Conference on Advanced Semiconductor Devices and Microsystems, Oct. 2002, pp. 243-246.

L.F. Tiemeijer et al., "A Record High 150 GHz fmax Realized at 0.18μm Gate Length in an Industrial RF-CMOS Technology," in IEEE International Electron Devices Meeting, Dec. 2001, pp. 10.4.1-10.4.4.

T. Yao et al., "Algorithmic Design of CMOS LNAs and PAs for 60-GHz Radio", IEEE Journal of Solid-State Circuits, May 2007, pp. 1044-1057, vol. 42, No. 5.

K. Choi et al., "Parasitic-Aware Design and Optimization of a CMOS RF Power Amplifier", IEEE Trans. Circuits and Systems-I, Jan. 2006, pp. 16-25, vol. 53, No. 1.

A. Komijani et al., "A 24-GHz, +14.5-dBm Fully Integrated Power Amplifier in 0.18-um CMOS", IEEE Journal of Solid-State Circuits, Sep. 2005, pp. 1901-1908, vol. 40, No. 9.

Search Report and Written Opinion for PCT/US2009/03947 dated Jul. 27, 2009.

* cited by examiner

EQN. (1)   $$f_T = \frac{g_m}{2\pi(C_{gs}+C_{gd})}$$

EQN. (2)   $$f_{MAX} = \sqrt{\frac{f_T}{8\pi(R_g)(C_{gd})}}$$

US 9,190,479 B1

TRANSISTOR STRUCTURE HAVING AN ELECTRICAL CONTACT STRUCTURE WITH MULTIPLE METAL INTERCONNECT LEVELS STAGGERING ONE ANOTHER

CROSS-REFERENCE TO RELATED APPLICATION(S)

This application is a Divisional of U.S. application Ser. No. 13/347,851, filed on Jan. 11, 2012, which is a Divisional of U.S. application Ser. No. 12/116,470, filed on May 7, 2008, now U.S. Pat. No. 8,178,908, the disclosures of which are incorporated herein by reference.

This invention was made with Government support under Contract Nos.: N66001-05-C-8013 and N66001-02-C-8014 awarded by the DARPA—Defense Advanced Research Project Agency. The Government has certain rights in this invention.

FIELD OF THE INVENTION

The present invention relates generally to semiconductor devices and integrated circuits (ICs) and, more particularly, the invention relates to the layout of field effect transistors (FET) implemented in complementary metal oxide semiconductor (CMOS) technology.

BACKGROUND OF THE INVENTION

CMOS technology is receiving increasing attention for radio frequency and millimeter wave (mmWave) applications due to integration of digital processors and memory circuits with RF circuits. Cut-off frequency ($f_T$) and maximum oscillation frequency ($f_{MAX}$) are recognized as performance figures-of-merit for semiconductor devices. $f_T$ is the frequency at which the forward small-signal, short-circuit current gain of an active device has a value of unity. $f_{MAX}$ is the frequency at which the power gain of the device falls to unity. As the frequency of operation of ICs moves closer to the peak $f_T$ and $f_{MAX}$ of the technology, layout optimization becomes crucial to the design.

As is well known, $f_T$ and $f_{MAX}$ for a CMOS device are mainly limited by the parasitic components associated with the devices gate, source and drain connections in addition to the intrinsic transit time from source to drain across the device channel. The most significant parasitics are the gate-source capacitance (Cgs), gate-drain capacitance (Cgd) and gate resistance (Rg). For an FET, FIG. 1A is a top view 100 of the FET, FIG. 1B is a cross-section view 120 of the FET, and FIG. 1C illustrates a simplified equivalent circuit schematic 140 of the FET. The views 100, 120 and 140 show the parasitic capacitances Cgs 122, Cgd 123 and Cds 124. Equivalent circuit 140 and view 100 also show the gate resistance (Rg) 141. In FIG. 2, equations 1 and 2 show the fundamental theoretical relationship between the parasitic components and the FET figures of merit. Each parasitic element in these equations consists of a component intrinsic to the device and an extrinsic component related to its metal interconnections.

Contemporary ICs, such as input-out drivers or power amplifiers, face multiple challenges. They operate at RF and mmWave frequencies while amplifying, receiving or delivering signals with voltage amplitudes comparable to or higher than the power supply of the circuit, and/or a power in the order of milliwatts or higher. Connections to devices in ICs, for example, connections to an FET device, will operate at relatively large current densities and may face electromigration (EM) reliability issues. When electrical current flows through metal conductors or interconnections, EM or current limiting mechanisms due to heat may occur, causing failure of ICs. EM is due to metal atoms being pushed, in proportion to the current density, by the electron flow comprising the current. This may cause disconnection of the interconnection or an open circuit. As the cross-section of metal interconnects becomes smaller with technology scaling, current density becomes larger for a given amount of current being carried, and EM becomes more severe.

An EM compliant FET usually requires a larger amount of metallization. This adds parasitic capacitance and resistance, degrading the device cut-off frequency ($f_T$) and maximum oscillation frequency ($f_{MAX}$). An FET that must handle large signals at high frequencies faces the challenge of both, being EM compliant with respect to high direct current and high alternating current, and attaining the highest possible $f_T$ and $f_{MAX}$.

As is known in the art, ICs usually are fabricated to include a plurality of metal conductor layers, typically up to 8. The metal layers are interconnected using vias. In ICs operating at RF and mmWave frequencies, the connections between devices and sub-circuits to communicate electrical signals are usually implemented with transmission line structures formed by a conductor at a high metal level and a ground plane at a low metal level. The high metal levels are usually thicker, therefore providing lower resistance, and are a longer distance from lower metal levels, where the ground plane usually resides. Both characteristics are desirable for transmission line design. An effective layout design for an FET operating at RF and mmWave frequencies must take into account all of the metal levels and vias required for its connection to the highest metal levels of the technology, where transmission lines will carry the signals related to the device.

In U.S. Pat. No. 7,132,717, the disclosure of which is incorporated herein by reference, a power metal oxide semiconductor transistor layout is disclosed. The power metal oxide semiconductor transistor layout uses network of conductive lead line as a connection or a network connection to connect source and drain regions thereby achieves advantages of a high uniformity of current, low Rds_on, much less power loss, an actual line density two times larger than that of conventional layouts and a strengthened resistance to electron migration.

In U.S. Pat. No. 6,958,541, the disclosure of which is incorporated herein by reference, a region on a substrate contains multiple transistors in parallel that share a single salicided polysilicon gate electrode. Above or below the gate electrode are formed multiple plugs of refractory material along the length of the gate electrode. The multiple plugs of refractory material electrically interconnect the gate signal line and the salicided polysilicon gate electrode. The plug material is selected to minimize the work function between it and the salicided polysilicon gate electrode.

SUMMARY OF THE INVENTION

Principles of the invention provide an improved transistor having improvements in, for example, electromigration compliance and performance. Features of an exemplary FET transistor of this invention are a source and drain terminal electrical contact structure, a multi-level metal ring connecting gate rectangles on both ends, and a wider-than-minimum gate-to-gate spacing.

In accordance with one aspect of the present invention, an electrical contact structure is provided, wherein the electrical contact structure distributes current along a length thereof. The electrical contact structure comprises a plurality of n metal rectangles on n levels of metal, wherein the rectangle on one metal level is at least as wide in width and vertically covers in width the rectangle on the metal level immediately below, wherein the rectangle on one metal level is shorter in length than and substantially aligned at a first end with the rectangle on the metal level immediately below, and wherein rectangle first ends are substantially aligned.

In accordance with another aspect of the present invention, a transistor is provided. The transistor comprises at least one electrical contact structure comprising a plurality of n metal rectangles on n levels of metal, wherein the rectangle on one metal level is at least as wide in width and vertically covers in width the rectangle on the metal level immediately below, wherein the rectangle on one metal level is shorter in length than and substantially aligned at a first end with the rectangle on the metal level immediately below, wherein rectangle first ends are substantially aligned, and wherein the metal rectangle on each metal level except the lowest metal level is coupled with the metal rectangle on the metal level immediately below. The transistor also comprises a gate terminal. The gate terminal comprises at least one gate rectangle, wherein gate rectangles are oriented in the same direction. The transistor also comprises two source-drain terminals each comprising at least one source-drain rectangle, wherein the at least one source-drain rectangle is coupled to at least one electrical contact structure.

In accordance with another aspect of the present invention a method for supplying current to source-drain regions of a transistor is provided. The method comprises the step of contacting and supplying current to a diffused rectangular source-drain region of the transistor, wherein the current is supplied through a lowest metal level first rectangular metal conductor. The first rectangular metal conductor substantially overlaps the source-drain region, is coupled to the source-drain region, and has a first end. The method also comprises contacting and supplying current to the first rectangular metal conductor. The current is supplied through n rectangular metal conductors on n metal levels. The rectangular metal conductor is coupled to the rectangular metal conductor on the immediately lower metal level. The rectangular metal conductor is aligned at the first end with the rectangular metal conductor on the immediately lower metal level, and the rectangular metal conductor first ends are substantially aligned. The rectangular metal conductor is shorter in length than the rectangular metal conductor on the immediately lower metal level. The rectangular metal conductor is at least as wide in width as the rectangular metal conductor on the immediately lower metal level, and the rectangular metal conductor is partially overlapping the rectangular metal conductor on the immediately lower metal level.

These and other objects, features, and advantages of the present invention will become apparent from the following detailed description of illustrative embodiments thereof, which is to be read in connection with the accompanying drawings.

DETAILED DESCRIPTION

It is well known in the art that IC are fabricated with many levels of metal used for interconnect or signal or power supply routing. All metal levels are substantially in planes above and parallel to the surface of the silicon. The lowest level metal will be closest to the surface of the silicon, and the highest level of metal furthest away, with intermediate levels between. Metal connectors, interconnects and runners are terms used to indicate a route of metal used as a connection. These connectors, interconnects and runners are typically constructed form one or more rectangular features, typically but not necessarily, long and narrow. Metal connectors, interconnects and runners may be constructed on multiple levels of metal, sometimes having similar shape and size rectangles over or partially over, that is overlapping or partially overlapping, each other with vertical connections, called vias, physically located between and connecting overlapping features on different metal levels. ICs typically, but not always, have 5 to 8 metal levels.

FET transistors typically have at least three terminals, gate, source and drain. Current flows between the source and drain and is modulated by the gate. The gate is usually at least partially constructed from polysilicon material, usually in the shape of a rectangle or multiple parallel rectangles. The source and drain are at least usually partially constructed by implanting or diffusing impurities into the source and drain areas of the FET. The source drain areas are usually rectangular. The impurities are put into these areas on the silicon by diffusion or implantation and are typically called diffusion areas. The gate polysilicon, drain diffusion areas and source diffusion areas are typically connected to metal to allow electrical connection.

It is understood that the physical structures comprising an FET are three dimensional. However for ease of explanation, three dimensional gate, source, drain and metal runner volumes will be referred to in a two dimensional sense as they appear when looking down for above. For example, a metal connector will be referred to as a rectangle instead of a rectangular cube where the thickness of the metal along the axis perpendicular to the plane of the silicon will be ignored. This is not meant to in any way limit the invention.

Figure 1A:
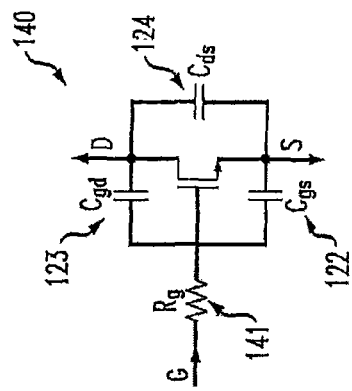
FIG. 1A is a top view of an FET.
Figure 1B:
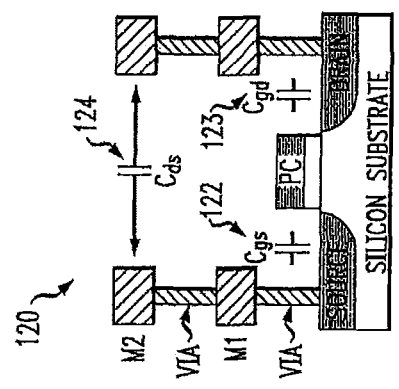
FIG. 1B is a cross-section view of the FET of FIG. 1A.
Figure 1C:
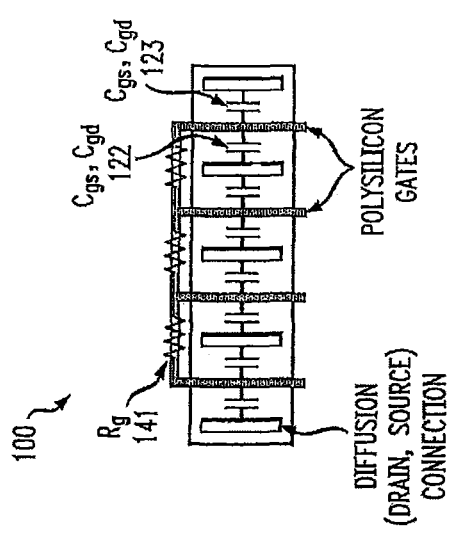
FIG. 1C illustrates a simplified equivalent circuit schematic of the FET of FIGS. 1A and 1B.
Figures 2, 3:
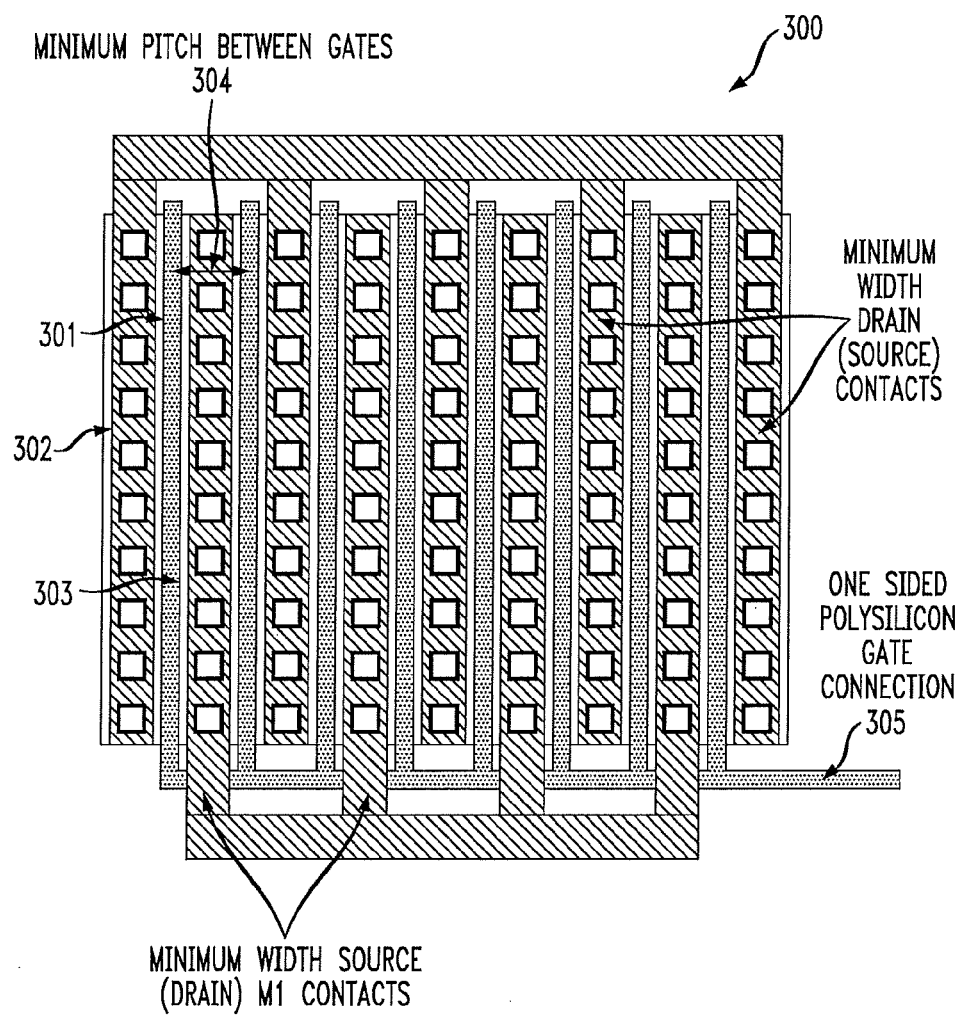
FIG. 2 contains equations showing the impact of FET parasitics on current and power cut-off frequencies
FIG. 3 is a top view of a conventional FET transistor.

As shown in FIG. 3, a conventional FET transistor 300 consists of a plurality of parallel polysilicon gate fingers or rectangles 301 situated between diffusion or implanted source-drains regions or rectangles and their connections 302 and 303. The gate rectangles are usually connected together on one side by a polysilicon rectangle 305 perpendicular to the gate rectangles. The minimum allowed gate rectangle to gate rectangle spacing 304, known as gate pitch or gate-to-gate spacing, is set by the design rules for the fabrication technology. Design rules are typically determined by the engineers that develop the fabrication technology. They are typically a set of published rules that govern physical design of transistors, metal conductors and other electrical components to be fabricated in the target technology. There purpose is to ensure high yield manufacture. To save area, the minimum allowed spacing is typically used. The lowest level of metal is typically used to contact the source-drain diffusions. Additional metal levels may or may not be places over and coupled to the lowest metal level for contacting source and drain diffusions. When multiple metal levels are used, typically all metal levels run substantially the entire length of the diffusion. These metal and diffusion features are also usually at the minimum separation allowed by the design rules for the fabrication technology. For each metal level, the design rules typically specify a minimum allowed metal-to-metal spacing. For diffusions, the design rules typically specify a minimum allowed diffusion-to-diffusion spacing. In a similar way, the minimum spacing between gates, source, and drain connections is typically employed. In a contemporary integrated circuit design flow, this is the kind of design layout that computer-aided-design software would generate for FET transistors employed in digital circuits. This FET transistor layout results in a relatively high gate resistance Rg, relatively high Cgd, Cgs and Cds due to the side-wall capacitance between drain, source and gate which are tightly spaced. Gate resistance, Rs, becomes higher as the FET becomes longer and has more fingers. Moreover, this layout would not tend to be electromigration compliant for the current densities required to handle large signals. Stacking metal layers vertically at the drain and source connections could reduce the current density per metal layer but at the expense of even larger amounts of side-wall capacitance.

Figure 4:
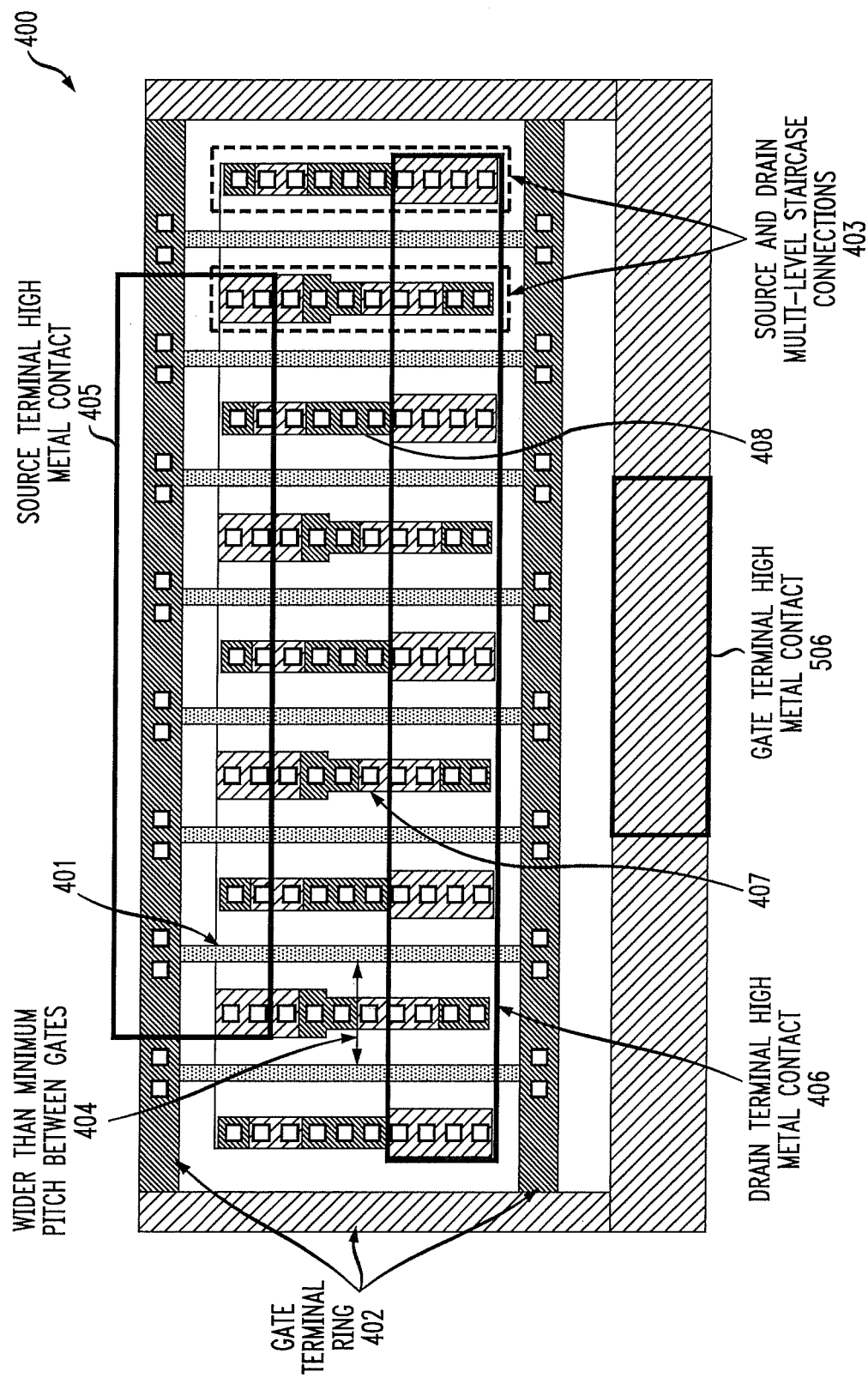
FIG. 4 is a top view of an FET transistor according to an embodiment of the present invention.

FIG. 4 presents a top-level overview of an embodiment of the present invention 400. It is to be understood that even though this drawing shows eight transistor gate fingers or rectangles 401 with associated sources and drains, the features of the present invention apply to any number of parallel gate fingers with associated sources and drains. The main characteristic features of the FET transistor of this invention are: (1) a source and drain terminal electrical contact structure 403 built from a staircase of interconnected overlapping metals, (2) a multi-level metal 402 connecting all gate rectangles on both ends of gate rectangles, and (3) a wider-than-minimum gate-to-gate spacing 404. These features are explained in detailed.

Figure 5:
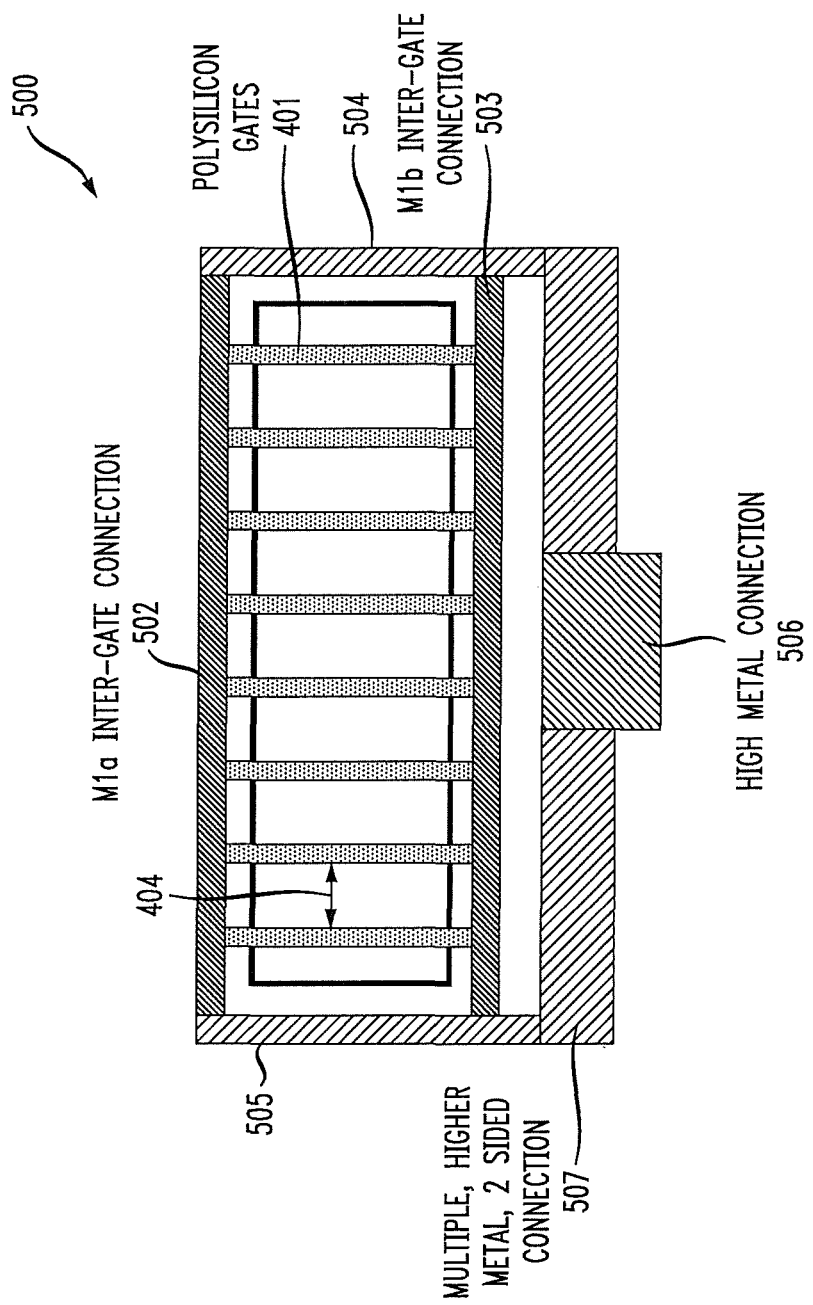
FIG. 5 is a top view of the gate structure of an FET transistor according to an embodiment of the present invention.

A feature of an embodiment of the present invention is shown in FIG. 5. FIG. 5 shows the gate structure with metal interconnect 500. The polysilicon gate rectangles 401 are shown. The gate-to-gate spacing or gate pitch 404, i.e. the distance between the gate polysilicon rectangles, is wider than the design rule for the minimum gate-to-gate separation for the fabrication technology. All gate rectangles are connected together at the ends of the gate rectangle on both sides of the FET through two first level metal connections (M1*a* and M1*b*) 502 and 503 which are metal rectangles. These two parallel M1 gate connections 502 and 503 are orthogonal or perpendicular to the gate rectangles 401. The two M1 rectangles 502 and 503 are connected together through two stacked sets of multi-level metal connectors (MSa and MSb) 504 and 505, which are metal rectangular. The MS connectors 504 and 505 are parallel to the gate rectangles. The M1 connectors 502 and 503 with MS connectors 504 and 505 form a multi-level rectangular ring gate connector around the active area of the FET, the active area being the source, drain and gate areas. Another multi-level rectangular metal connector 507 connects MSa and MSb to top level metal connection terminal 506. The multi-level metal connector 507 does not include the lowest two level of metal so that these metal levels can be used for routing under connector 507. Although this embodiment does not use the lowest two levels of metal in conductor 507, other embodiments are not so limited and may use these levels or may be otherwise limited and not use other specific levels of metal. Using the gate connection structure including connectors 502, 503, 504, 505, and 507 in the manner described, the equivalent resistance seen by each gate finger is minimized. Even though the area for the overall gate terminal is larger than that in a conventional layout, the direct connection to the gate polysilicon is with first level metal rather than polysilicon and further gate interconnect is with higher metals levels, hence the increase in Cgs is not significant.

Figure 7:
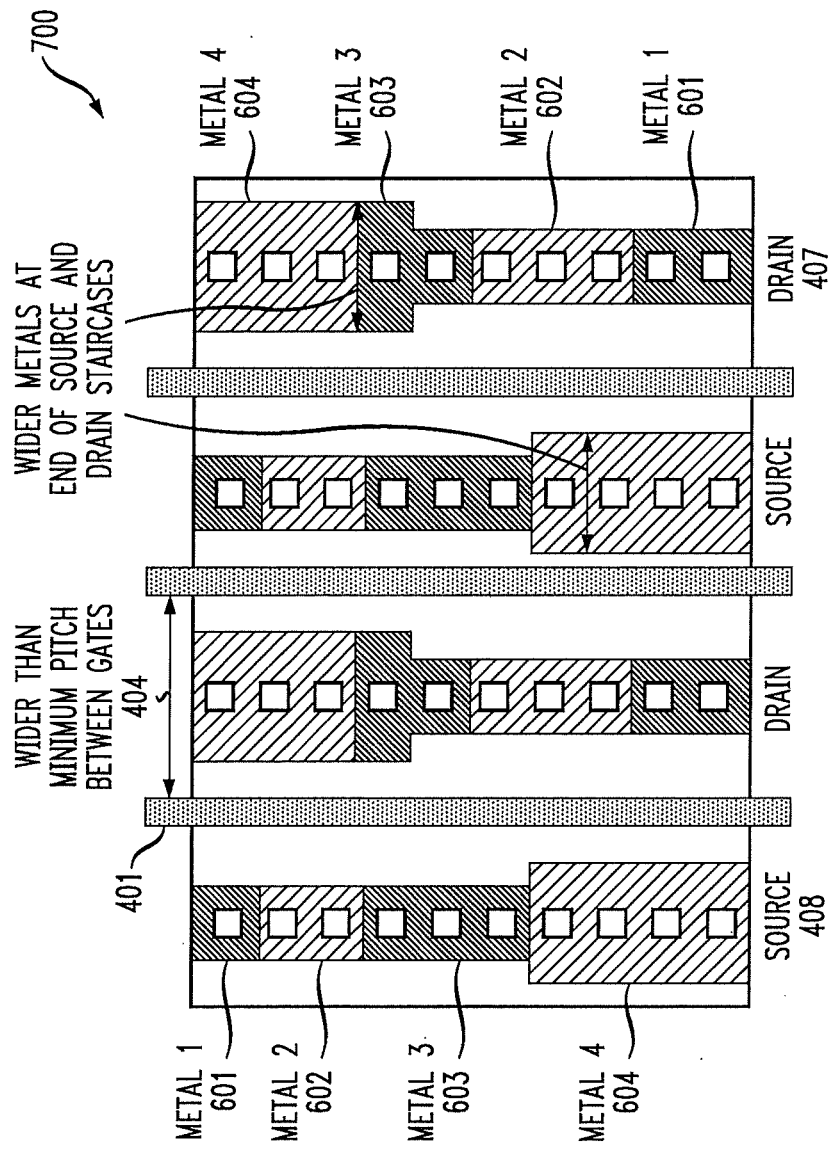
FIG. 7 is a top view of FET transistor components according to an embodiment of the present invention.

A feature of the embodiment that is illustrated in FIGS. 4, 5 and 7, is the wider than minimum distance between adjacent polysilicon gates 404. This feature results in reduced gate-drain parasitic capacitance, Cgd, gate-source parasitic capacitance, Cgs, enhanced thermal dissipation, higher stress and allows wider-than-minimum metal connection for enhanced current driving capability.

Figure 6:
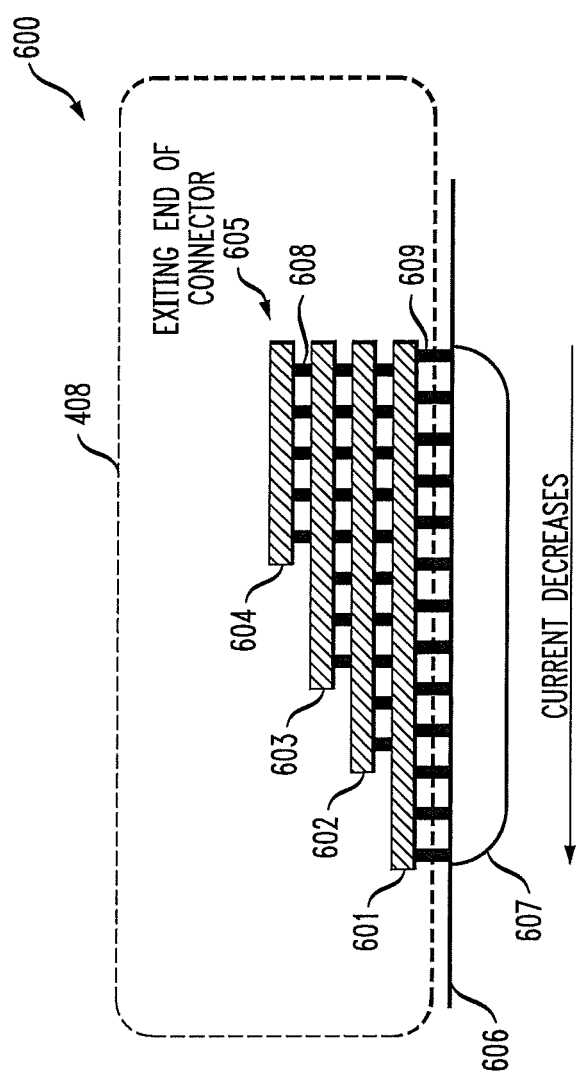
FIG. 6 is a cross-section of a source-drain contact structure according to an embodiment of the present invention.

Another feature of an embodiment of the invention is a staircase-like multiple level metallization for source and drain connections. Because the contacts and other aspects of source and drain structures are similar, source and drain structures will sometimes be referred to collectively using the term source-drain. The terms staircase, staircase structure, staircase connector and electrical contact structure all refer to the same structure and are used interchangeably. FIG. 6 illustrates the source-drain structure 600, comprising the source-drain diffusion 607 and the electrical contact structure 408 that is the staircase-like metallization structure used for source and drain connections. Metal connection is made to the source-drain diffusion 607 along substantially the entire length of the diffusion by a metal connector 408 having an exiting-end 605 only at one end of the diffusion 607. The term exiting-end means the end of the connector through which current is supplied to or extracted from. It is the end of the connector that is meant to be coupled to another conductor. Thus the current carried by the connector 408 is highest at the exiting-end and decreases as the connector get further along the diffusion. As the amount of current increases towards the exiting-end of the connector, the number of metal layers stacked in parallel increases, forming a staircase of metal layers 408. In the embodiment shown in FIG. 6, at the low current end of the connector there is only the lowest level of metal 601. As the current increases towards the exiting-end of the connector, metal layers 602, 603, and 604 are progressively added. To conduct current form one metal level to another, coupling vias 608 are between metal layers. To conduct current between the lowest metal level 601 and diffusion 607, coupling vias 609 are between the lowest metal level 601 and diffusion 607.

As higher metal levels are stacked closer to the exiting-end in this staircase structure, those added metal levels are made progressively wider than the underlying metal layer and thus progressively wider than the minimum allowed by the design rules of the technology. Using this metallization strategy, the current density at each metal level can be controlled to assure electromigration reliability compliance.

Figure 8:
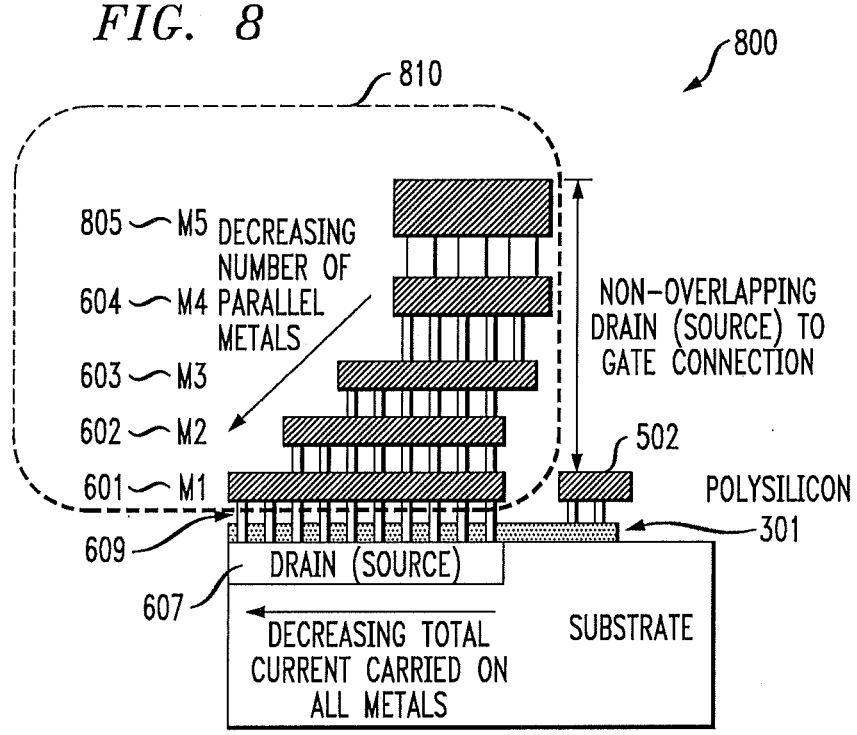
FIG. 8 is a cross-section of a source-drain contact structure according to an embodiment of the present invention.

In this embodiment as shown if FIG. 4, the source staircase structures 408 are oriented in opposite directions from the drain staircase structures 407, that is, the exiting-ends are on opposite sides of the device. Correspondingly, as shown in FIG. 4, the final source contact 405 and drain contact 406 are in opposite sides of the FET transistor. Moreover, as shown in FIG. 7, the staircase design for each source staircase 408 or drain staircase 407 can be different since their current densities are not necessarily the same. With respect to a metallization strategy in which multiple metal strips of equal length would be placed in parallel without a staircase, for this embodiment of the invention, the amount of side-wall capacitance between the source and drain contacts is reduced. This reduces Cds capacitance. The fringing capacitance between the different metal levels and the polysilicon gate is also reduced, reducing Cgd and Cgs. A more detailed cross-section view of the staircase metallization is shown in FIG. 8. The staircase metallization shown in FIG. 8 comprises the same four metal layers shown in FIGS. 6 (601, 602, 603 and 604) and an additional higher metal layer 805. A vertical metal overlap between electrical contact structure drain connection 810 and gate connection 502 is avoided to reduce the Cgd parasitic capacitance.

In the embodiment, shown in FIG. 4, an overall source connector 405 is used to couple all of the source staircases on one side of the FET transistor and an overall drain connector 406 is used to couple all of the drain staircases on the other side of the FET transistor. The overall source connector is a rectangle and includes metal levels that do not include the lowest metal level or any overlapped metal level within the drain staircase connector 407. The overall drain connector is a rectangle and includes metal levels that do not include the lowest metal level or any overlapped metal level within the source staircase connector 408. Although in this embodiment connectors 405 and 406 are rectangles, the invention is not so limited and connectors 405 and 406 may have other geometric shapes.

In an alternate embodiment overall drain connector 406 will not overlap any source staircase connectors 408 and source overall source connector 405 will not overlap any drain staircase connectors 407. This is to reduce drain to source parasite capacitance Cds. In this alternate embodiment overall source and overall drain connectors may include metal levels used in the source and/or drain staircase connectors.

Figure 9:
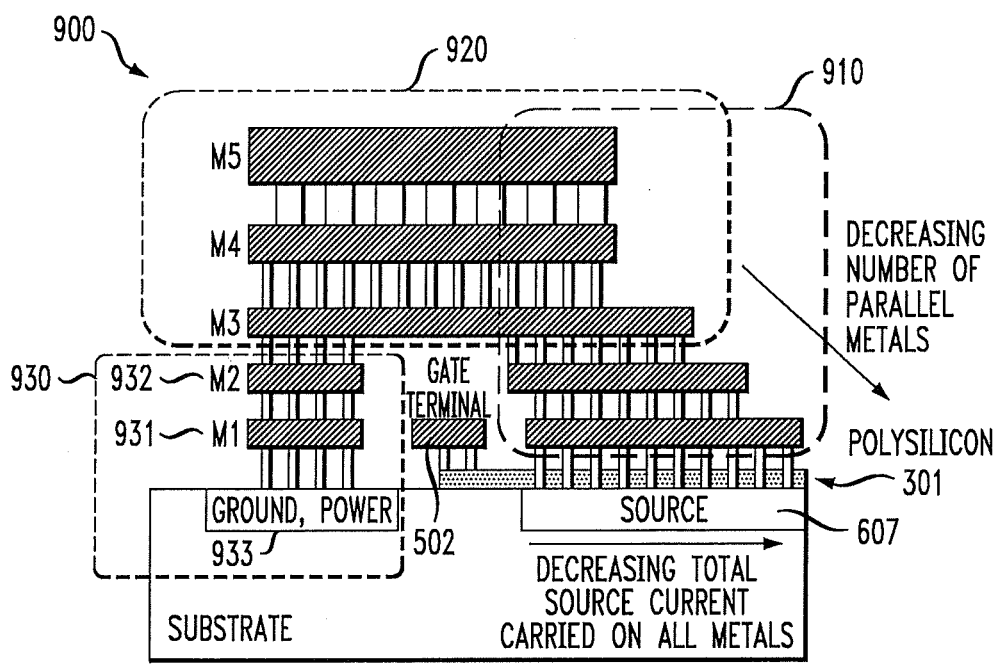
FIG. 9 is a cross-section of a source-drain contact structure according to an embodiment of the present invention.

Another embodiment of the present invention is shown in FIG. 9 which is a structure 900 comprising: a ground plane 930, source diffusion 607, polysilicon gate 301 and gate terminal 502, staircase source terminal 910 coupled to the source diffusion 607, and a bridge structure 920 coupled to the source staircase structure 910 and ground plane 930. In this embodiment, the source terminal 910 is to be connected to a ground plane 930 at a low metal level, instead of a transmission line on a high metal level. In the embodiment shown, the ground plane consists of diffusion 933 and low level metal levels 931 and 932. Note however, that the ground plane is not thus limited but could consist of diffusion 933, or one or more low level metal level such as 931 and 932, or both diffusion 933 and one or more low level metal levels such as 931 and 932. A multiple metal level bridge 920 is built from the staircase connector 910, over the gate terminal 502, and connecting to the ground plane 930. This give a low resistance connection form the source to ground. In this embodiment, the bridge does not use the level of metal immediately above the gate terminal in passing over the gate terminal. This is to avoid additional Cgs parasitic capacitance. Note that although this embodiment does not use this level, the invention is not so limited and may use this level. Note that this aspect of the invention is not restricted to connecting to a ground plane or terminal, but could connect to any power or signal plane or terminal.

The embodiment of FIG. 9, where the source terminal is connected to a ground plane, is most common in the case of an n-type FET transistor. An alternate embodiment, where the source is connected to a power plane, is most common in the case of a p-type FET transistor.

Figure 10:
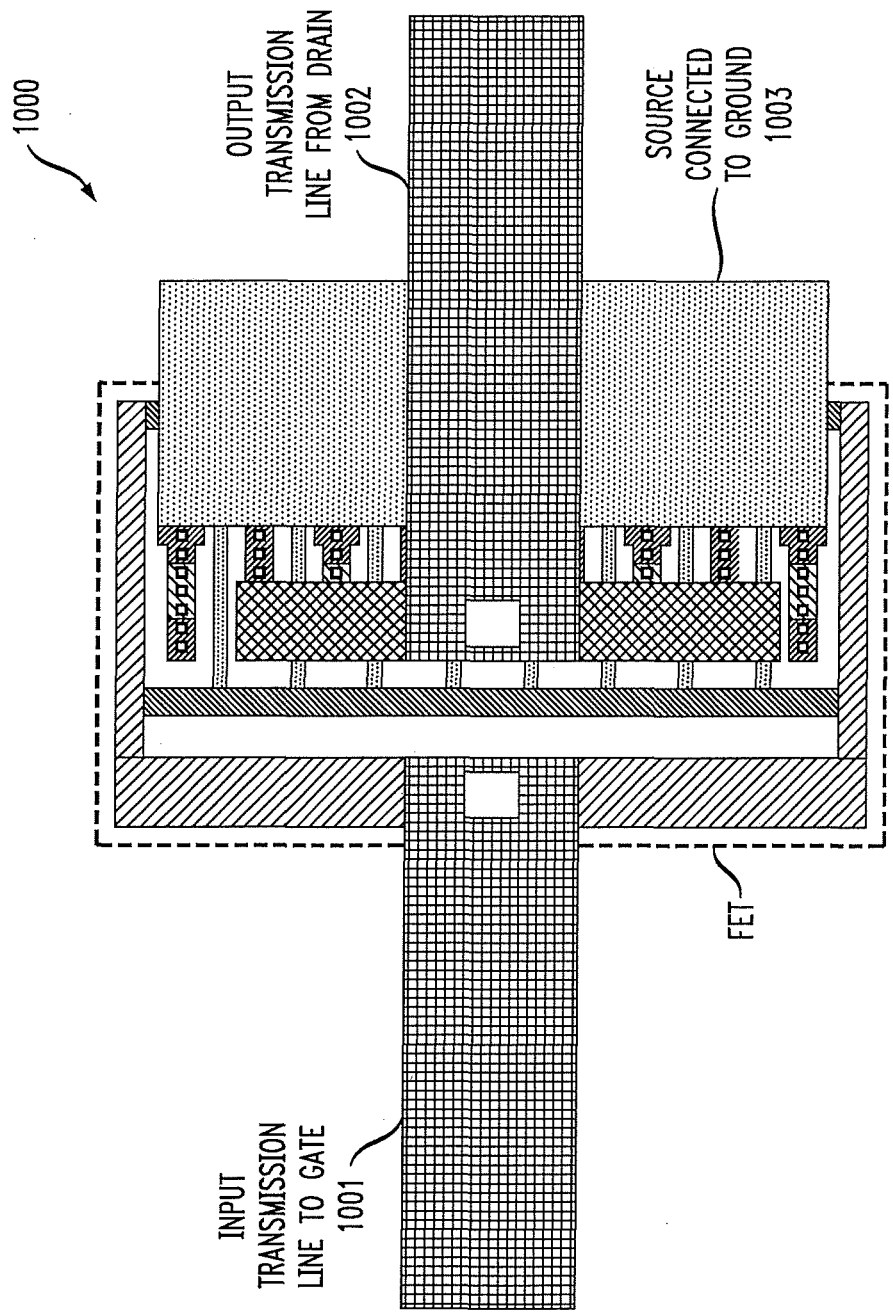
FIG. 10 is a top view of an FET transistor used with transmission lines according to an embodiment of the present invention.

FIG. 10 shows an alternate embodiment which is an FET layout 1000 that gives a convenient connection of high-level metal to transmission lines 1001 and 1002. This is useful for use of these devices in RF and mmWave applications. This embodiment uses the source to ground bridge structure 1003 described in FIG. 9

Figure 11:
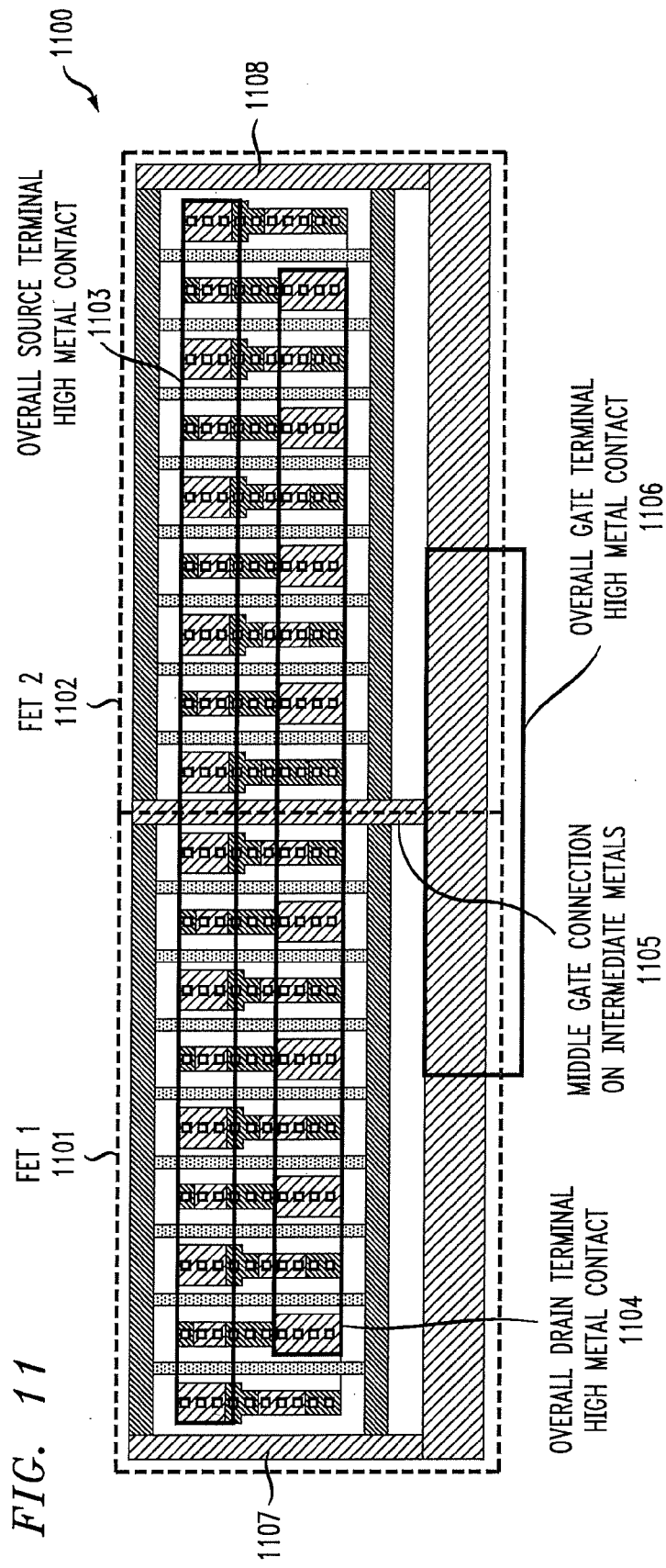
FIG. 11 is a top view of two FET transistors in parallel according to an embodiment of the present invention.

In another embodiment of the present invention, shown in FIG. 11, a composite FET transistor 1100 comprising two of FET transistors 1101 and 1102 as the test describes with reference to FIG. 4. FET transistors 1101 and 1102 are combined in parallel to form an equivalent FET transistor 1000 with a larger number of gate fingers than each FET transistor 1101 and 1102 separately. For a given number of total gate fingers required by the design, one option is to include all of them on a single FET as in the embodiment of the invention shown in FIG. 4. However, a very large number of gate fingers leads to a long device and to a relatively large gate resistance for the gate fingers at the center. An alternative is the embodiment shown in FIG. 11 which connects two individual FET transistors 1101 and 1102, each having a lower number of gate fingers, in parallel. The advantage of this embodiment is that the two sides (upper and lower) of the gate ring connection are not only connected by a left end connector 1107 and a right end connector 1108 but also at one middle connector 1105 at a point that separates one FET transistor from the other. Since these gate ring connections are done with multiple intermediate metal levels, as described above with reference to FIG. 5, their resistance is very low, and the equivalent gate resistance seen by each gate finger of the composite larger FET transistor 1100 will be substantially the same as that seen in the case of an individual FET component transistor 1101 or 1102. It is noted that although this embodiment shows two combined FET transistors, the invention is not thus limited and may combine more than two FET transistors in a similar manner.

Figure 12A:
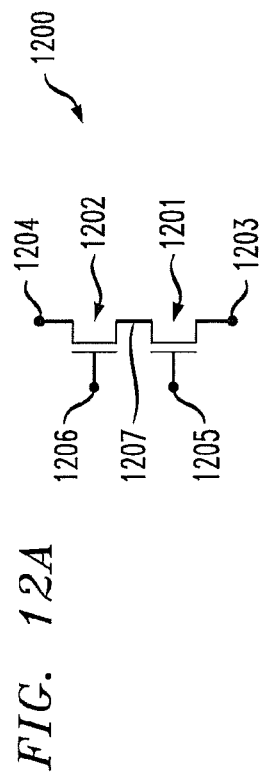
FIG. 12A is a schematic view of two FET transistors connected in series.
Figure 12B:
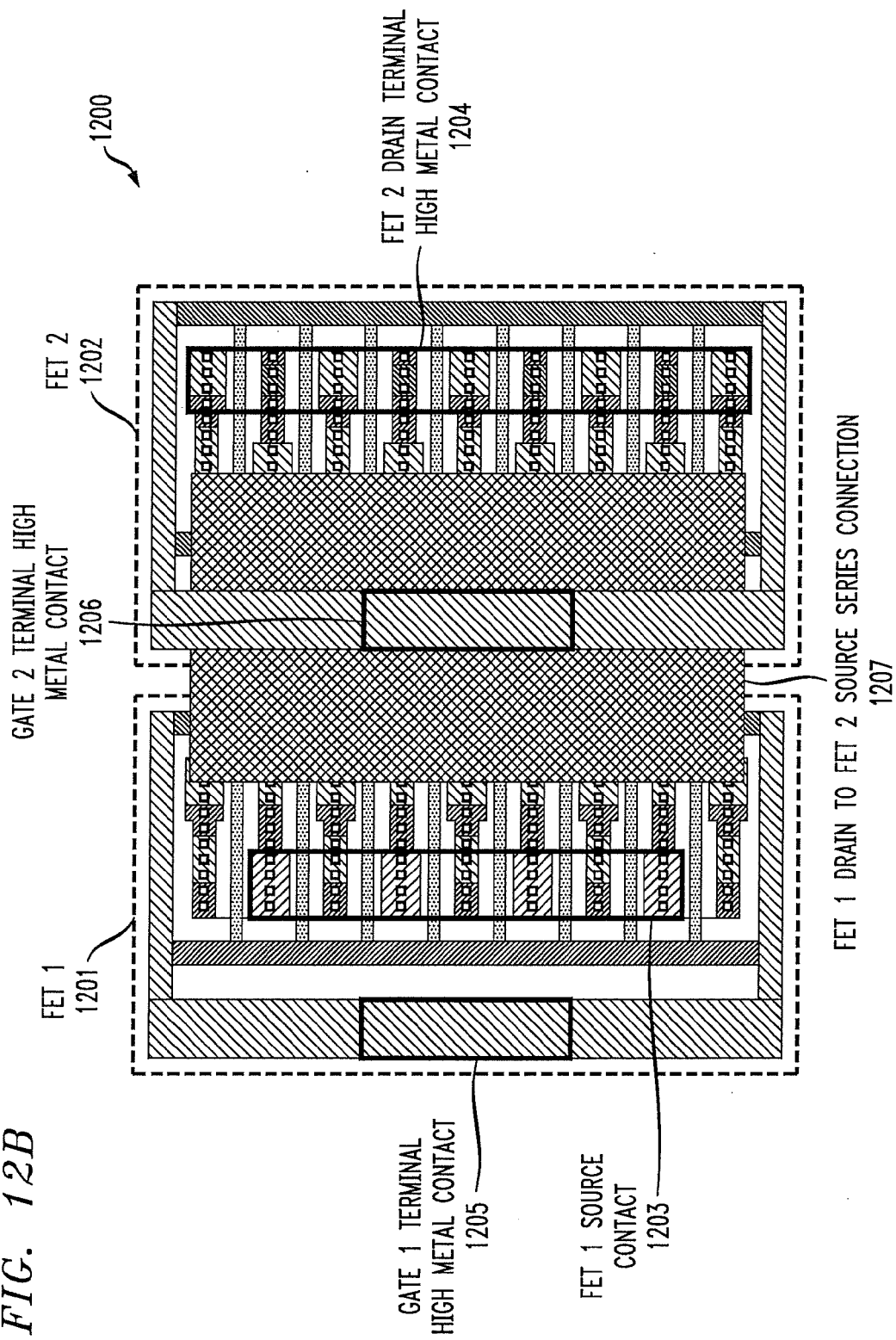
FIG. 12B is a top view of two FET transistors connected in series according to an embodiment of the invention.

Another embodiment of the present invention is presented in FIGS. 12A and 12B. This embodiment is a series arrangement 1200 of two FET transistors 1201 and 1202. In RF and mmWave applications, amplifiers and drivers frequently employ two devices in series in what is called a cascode amplifier configuration. FIG. 12A is a schematic diagram of the series cascode configuration. FIG. 12B shows how two individual FET transistors, each constructed according to the present invention, are combined to form the series cascode configuration. FET transistor 1201 has a source contact 1203 using a high metal level. FET transistor 1202 has a drain contact 1204 using a high metal level. The drain of FET transistor 1201 is coupled to the source of FET transistor 1202 using two series bridge structure contacts 1207 describe above with reference to FIG. 9. An example bridge structure is 920 in FIG. 9. The first bridge contact couples to the drain of FET transistor 1201 to the second bridge contact. The second bridge contact couples to the source of FET transistor 1202 to the first bridge contact. Both gate terminals have separate high metal level contacts 1205 and 1206. It is noted that although the shown embodiment is two FET transistors in series, the invention is not thus limited and can similarly arrange more than two FET transistors in series.

Figure 13B:
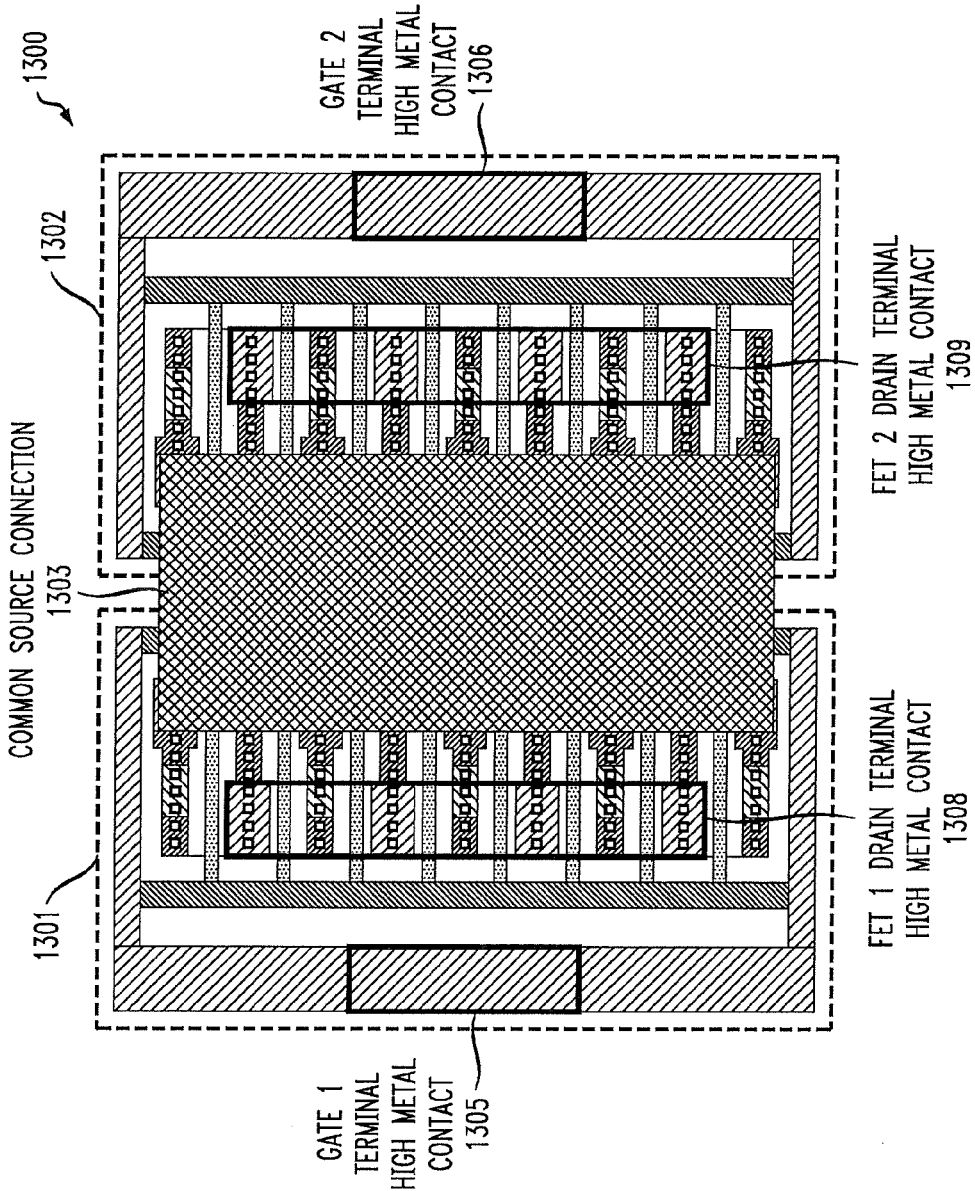
FIG. 13B is a top view of two FET transistors connected as a differential pair according to an embodiment of the invention.
Figure 13A:
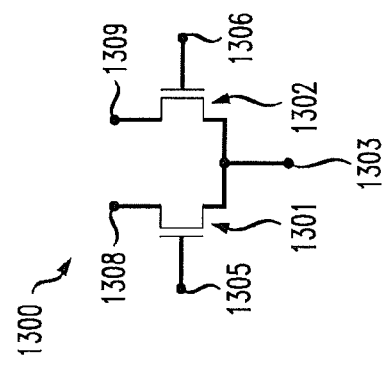
FIG. 13A is a schematic view of two FET transistors connected as a differential pair.

Yet another embodiment is shown in FIGS. 13A and 13B. This embodiment is a two transistor differential configuration 1300 commonly used in RF and mmWave applications. This embodiment is a differential pair, in which two FET transistors 1301 and 1302 share a common source 1303 and keep separate gate terminals 1305 and 1306 and separate drain terminals 1308 and 1309. The gate terminals 1305 and 1306 and the drain terminals 1308 and 1309 are high metal level contacts. The source of FET transistor 1301 is coupled to the source of FET transistor 1302 using two series bridge structure contacts 1303 describe above with reference to FIG. 9. An example bridge structure is 920 in FIG. 9. The first bridge contact couples to the source of FET transistor 1301 to the second bridge contact. The second bridge contact couples to the source of FET transistor 1302 to the first bridge contact. Both gate terminals have separate high metal level contacts 1305 and 1306.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A transistor, comprising:
an electrical contact structure comprising:
a plurality of n metal rectangles on n levels of metal, wherein the metal rectangle on an uppermost metal level of the electrical contact structure is wider and shorter than at least one other metal rectangle on a lower metal layer of the electrical contact structure;
a gate structure comprising a plurality of gate rectangles oriented in the same direction;
a plurality of source-drain diffusion regions, wherein each source-drain diffusion region is disposed adjacent to, and extends along a length of, at least one of the gate rectangles, wherein at least one source-drain diffusion region is coupled to the electrical contact structure; and
a metallic gate connection structure coupled to the gate structure, the metallic gate connection structure comprising:
a first metal rectangle on a first metal level, wherein the first metal rectangle is orientated perpendicular to the gate rectangles, and wherein the first metal rectangle is coupled to first ends of the gate rectangles;
a second metal rectangle on the first metal level, wherein the second metal rectangle is orientated perpendicular to the gate rectangle, and wherein the second metal rectangle is coupled to second ends of the gate rectangles, opposite the first ends of the gate rectangles;
a third metal rectangle on a second metal level, higher than the first metal level, wherein the third metal rectangle is coupled to first ends of the first and second metal rectangles;
a fourth metal rectangle on the second metal level, wherein the fourth metal rectangle is coupled to second ends of the first and second metal rectangles, opposite the first ends of the first and second metal rectangles; and
a fifth metal rectangle on a third metal level, higher than the second metal level, wherein the fifth metal rectangle is coupled to first ends of the third and fourth metal rectangles.

2. The transistor of claim 1, wherein the third and the fourth metal rectangles do not vertically overlap area including the gate structure and the source-drain diffusion regions.

3. The transistor of claim 1, wherein the metallic gate connection structure further comprises a gate contact terminal on a fourth metal level, higher than the third metal level, wherein the gate contact terminal is coupled to the fifth metal rectangle.

4. The transistor of claim 3 wherein the gate contact terminal does not overlap the area including the gate structure and the source-drain diffusion regions.

5. The transistor of claim 1, further comprising a plurality of the electrical contact structures;
wherein each of the source and drain diffusion regions is coupled to one of the plurality of electrical contact structures;
wherein the electrical contact structures coupled to the drain diffusion regions are parallel and oriented in the same direction such that the metal rectangles on the uppermost metal level of the electrical contact structures that are coupled to the drain diffusion regions are disposed on a first side of the gate structure; and
wherein the electrical contact structures coupled to the source diffusion regions are parallel and oriented in the same direction such that the metal rectangles on the uppermost metal level of the electrical contact structures that are coupled to the source diffusion regions are disposed on a second side of the gate structure, opposite the first side of the gate structure.

6. The transistor of claim 5, further comprising:
first interconnect, wherein first interconnect is a metal rectangle, wherein the first interconnect is coupled to the metal rectangles on the uppermost metal level of the electrical contact structures that are coupled to the source diffusion regions; and
second interconnect, wherein second interconnect is a metal rectangle, wherein the second interconnect is coupled to the metal rectangles on the uppermost metal level of the electrical contact structures that are coupled to the drain diffusion regions.

7. The transistor of claim 6, further comprising:
a bus conductor comprising a geometric feature on the side of the first metal rectangle that is opposite the side where the source-drain terminals reside,
wherein the bus conductor is coupled to the first interconnect,
wherein the first interconnect includes only metal levels other than the first metal level, and
wherein the first interconnect crosses over the first metal rectangle.

8. The transistor of claim 7, wherein the first interconnect is at least partially overlapping a source electrical contact structure, and wherein the first interconnect includes only metal levels other than the next metal level formed above the first metal level.

* * * * *